(12) United States Patent
Miyatake

(10) Patent No.: US 8,072,524 B2
(45) Date of Patent: Dec. 6, 2011

(54) SOLID-STATE IMAGE-SENSING DEVICE

(75) Inventor: Shigehiro Miyatake, Osaka (JP)

(73) Assignee: Konica Minolta Holdings, Inc., Tokyo (JP)

( * ) Notice: Subject to any disclaimer, the term of this patent is extended or adjusted under 35 U.S.C. 154(b) by 881 days.

(21) Appl. No.: 12/117,289

(22) Filed: May 8, 2008

(65) Prior Publication Data

US 2008/0284890 A1 Nov. 20, 2008

(30) Foreign Application Priority Data

May 14, 2007 (JP) .................................. 2007-127609

(51) Int. Cl.
H04N 3/14 (2006.01)
(52) U.S. Cl. ....................................................... 348/308
(58) Field of Classification Search .................... 348/308
See application file for complete search history.

(56) References Cited

U.S. PATENT DOCUMENTS

| 5,241,575 | A | 8/1993 | Miyatake et al. | 377/60 |
|---|---|---|---|---|
| 6,831,691 | B1 * | 12/2004 | Takada et al. | 348/308 |
| 6,927,884 | B2 | 8/2005 | Takada et al. | 358/513 |
| 6,967,682 | B1 | 11/2005 | Hagihara | 348/308 |
| 2004/0233304 | A1 | 11/2004 | Kakumoto et al. | 348/241 |
| 2006/0001061 | A1 | 1/2006 | Miyatake et al. | 257/292 |

FOREIGN PATENT DOCUMENTS

| JP | 3-192764 A | 8/1991 |
|---|---|---|
| JP | 2002-300476 A | 10/2002 |
| JP | 2006-50544 A | 2/2006 |

* cited by examiner

Primary Examiner — William Choi
(74) Attorney, Agent, or Firm — Sidey Austin LLP

(57) ABSTRACT

A solid-state image-sensing device has a MOS transistor (T1) connected to a photodiode PD (PD) and performing photoelectric conversion, and has, as an integrating circuit for amplifying and integrating the photoelectric current obtained by the photoelectric conversion, a MOS transistor T2 and a capacitor C. In the solid-state image-sensing device, integration operation is controlled by a MOS transistor T6 connected to the gate of the MOS transistor T2.

12 Claims, 10 Drawing Sheets

SOLID-STATE IMAGE-SENSING DEVICE

This nonprovisional application claims priority under 35 U.S.C. §119(a) on Patent Application No. 2007-127609 filed in Japan on May 14, 2007, the entire contents of which are hereby incorporated by reference.

BACKGROUND OF THE INVENTION

1. Field of the Invention

The present invention relates to a solid-state image-sensing device having pixels outputting an electric signal representing incident light. More specifically, the invention relates to a solid-state image-sensing device of which each pixel is built with transistors.

2. Description of Related Art

Used in various applications, solid-state image-sensing devices are classified into a CCD type and a CMOS type depending on the means they use to read out (extract) the photoelectric charges generated in photoelectric conversion elements. In the CCD type, the photoelectric charges resulting from photoelectric conversion by photodiodes are accumulated in the photodiodes and, at the end of an integration period for which they are accumulated, the accumulated photoelectric charges are outputted all at once to CCDs serving as signal transfer paths. The photoelectric charges thus outputted to the signal transfer paths are sequentially fed to an output circuit by being transferred while being accumulated in potential wells in the signal transfer paths. Thus the photodiodes of the individual pixels perform integration with identical timing, and this mode of image sensing operation is called "global shutter mode".

On the other hand, in the CMOS type, the electric charges accumulated in the pn-junction capacitances of photodiodes are read out directly via MOS transistors. Thus, in the CMOS type, signal electric charges attributable to the photoelectric charges resulting from photoelectric conversion by the photodiodes are transferred instantaneously via signal lines. Thus, while the pixels in a given horizontal row perform integration with identical timing, the pixels in different rows perform integration with different timing to achieve the shooting of one frame. This mode of operation is called "rolling shutter mode".

Disadvantageously, both the CCD type and the CMOS type suffer from narrow dynamic ranges. As an improvement, there have conventionally been proposed CMOS-type solid-state image-sensing devices that perform logarithmic conversion by converting the amount of incident light logarithmically (see Japanese Patent No. 2836147). These solid-state image-sensing devices have dynamic ranges as wide as expressed by five- to six-digit figures. Thus, with these solid-state image-sensing devices, even when a subject whose brightness distribution spreads across a considerably wide range is sensed, all the brightness information within that brightness distribution can be outputted in a form converted into an electric signal.

Now, the principle of the operation of a solid-state image-sensing device performing logarithmic conversion will be described briefly. FIGS. 13A and 13B are each a circuit diagram showing the basic configuration of each pixel in a CMOS-type solid-state image-sensing device. According to one configuration of each pixel in a CMOS-type solid-state image-sensing device, as shown in FIG. 13A, there are provided: a photodiode PD that serves as a photosensitive element performing photoelectric conversion; an N-channel MOS transistor T1 that has its gate and drain connected to the anode of the photodiode PD and that operates in a sub-threshold region; an N-channel MOS transistor T2 that has its gate connected to the node between the drain of the MOS transistor T1 and the anode of the photodiode PD; and a capacitor C of which one end is connected to the source of the MOS transistor T2. Here, the output signal is derived from the node between the source of the MOS transistor T2 and the capacitor C.

According to another configuration, as shown in FIG. 13B, there are provided: a photodiode PD; a MOS transistor T12 that has its source connected to the cathode of the photodiode PD and that operates in a sub-threshold region; a P-channel MOS transistor T2a that has its gate connected to the node between the source of the MOS transistor T12 and the cathode of the photodiode PD; and a capacitor C of which one end is connected to the source of the MOS transistor T2a. Here, the output signal is derived from the node between the source of the MOS transistor T2a and the capacitor C.

In these configurations, when the MOS transistors operate in a sub-threshold region, its gate voltage Vg, source voltage Vs, and drain current Id have the relation given by formula (1) below. In formula (1), q represents the amount of electric charge of an electron, k represents the Boltzmann constant, n represents the sub-threshold constant dependent on the structure of the transistor, T represents the absolute temperature, Id0 represents the drain current Id at the moment that a sub-threshold current starts to flow, and Vt represents the threshold voltage.

$$Id = Id0 \times \exp\left[\frac{q}{nkT}(Vg - Vs - Vt)\right] \quad (1)$$

In the configuration shown in FIG. 13A, when the operation of the MOS transistor T1 in the sub-threshold region causes the drain current Id given by formula (1) above to start to flow, the integrating circuit formed by the MOS transistor T2 and the capacitor C performs integration operation. Here, let the photoelectric current flowing through the photodiode PD be Ip and let the voltage appearing at the drain of the MOS transistor T1 be Vin, then, as a result of the MOS transistor T1 operating in the sub-threshold region, the relation given by formula (2) below holds.

$$I_p = Id0 \times \exp\left[\frac{q}{nkT}(Vin - Vt)\right] \quad (2)$$

Assuming that the MOS transistor T2 has identical characteristics with MOS transistor T1, the MOS transistor T2 then operates, like the MOS transistor T1, in the sub-threshold region, and thus the drain current of the MOS transistor T2 flows through the capacitor C. Thus, let the capacitance of the capacitor C be C and the output voltage at the source of the MOS transistor T2 be Vout, then the relation given by formula (3) below holds.

$$C\frac{dNout}{dt} = Id0 \times \exp\left[\frac{q}{nkT}(Vin - Vout - Vt)\right] \quad (3)$$

The relations given by formulae (2) and (3) give the relation given by formula (4).

$$\exp\left[\frac{q}{nkT}Vout\right]dVout = \frac{Ip}{C}dt \quad (4)$$

Assuming that, when the time t is 0, the output voltage Vout is 0, integrating formula (4) gives the output voltage Vout given by formula (5) below. That is, the output voltage Vout resulting from integration by the integrating circuit formed by the MOS transistor T2 and the capacitor C is proportional to the logarithm of the integral of the photoelectric current Ip. Thus, by finding the exponent of the output voltage Vout, it is possible to easily obtain a value proportional to the integral of the photoelectric current Ip.

$$Vout = \frac{nkT}{q}\ln\left[\frac{q}{nkTC}\int Ipdt + 1\right] \quad (5)$$
$$\approx \frac{nkT}{q}\ln\left[\frac{q}{nkTC}\int Ipdt\right]$$

In the configuration shown in FIG. 13B, a direct-current voltage Vr is fed, as a gate voltage, to the MOS transistor T12 to make it operate in the sub-threshold region. Here, assuming that the MOS transistors T12 and T2a have an equal sub-threshold constant n, which depends on their structure, let the constant depending on the relation between the characteristics of the MOS transistor T12 and the direct-current voltage Vr be "a", then the output voltage Vout appearing at the source of the MOS transistor T2a is given by formula (6) below.

$$Vout \approx Vr - \frac{nkT}{q}\ln\left[\frac{aq}{nkTC}\int Ipdt\right] \quad (6)$$

In a CMOS-type solid-state image-sensing device having pixels each configured basically as shown in FIG. 13A or 13B, since its shootable brightness range is wide compared with the brightness distribution of a subject, there appears, in a low-brightness or high-brightness region within the shootable brightness range, a region where no brightness data exists. To cope with this, the applicant of the present invention has proposed a CMOS-type solid-state image-sensing device that can be switched between linear conversion operation and logarithmic conversion operation as described above (Japanese Patent No. 3664035).

To automatize such switching between linear conversion operation and logarithmic conversion operation, the applicant has also proposed a CMOS-type solid-state image-sensing device in which the potential state of a transistor connected to a photodiode performing photoelectric conversion can be set appropriately (see JP-A-2002-300476). In this CMOS-type solid-state image-sensing device according to JP-A-2002-300476, by changing the potential state of the transistor, it is possible to switch the inflection point across which the device's photoelectric conversion is switched between linear conversion operation and logarithmic conversion operation.

A typical example of each pixel in solid-state image-sensing devices as exemplified by those disclosed in Japanese Patent No. 3664035 and JP-A-2002-300476 mentioned above is shown in FIG. 14. The pixel configuration shown in FIG. 14 is built on the basic configuration shown in FIG. 13A. Specifically, in the configuration shown in FIG. 14, the pixel that performs logarithmic conversion operation or that can be switched between linear conversion operation and logarithmic conversion operation includes, as in FIG. 13A, a photodiode PD, MOS transistors T1 and T2, and a capacitor C; in addition, it further includes: an N-channel MOS transistor T3 that receives at its gate the voltage appearing at the capacitor C to amplify it; an N-channel MOS transistor T4 that is connected between the source of the MOS transistor T3 and an output signal line 14 provided for the corresponding row; and an N-channel MOS transistor T5 for resetting the capacitor C.

In the pixel shown in FIG. 14 configured as described above, the MOS transistor T5, of which the drain is connected to the node between the capacitor C and the source of the MOS transistor T2, resets the voltage appearing at the gate of the MOS transistor T3. Moreover, as a result of linear conversion operation or logarithmic conversion operation, a voltage signal commensurate with the amount of incident light appears at the node between the capacitor C and the source of the MOS transistor T2, and this voltage signal is amplified by the MOS transistor T3. When the MOS transistor T4 is turned on, the voltage signal amplified by the MOS transistor T3 is outputted via the output signal line 14.

A CMOS-type solid-state image-sensing device of which each pixel is typically configured as shown in FIG. 14 performs vertical and horizontal scanning to perform image sensing operation in rolling shutter mode, and then outputs serially the image signals outputted from the individual pixels. In this way, image sensing operation is performed in rolling shutter mode, and thus image sensing operation in different rows is performed with different timing. As a result, in a case where a subject in a constantly changing state is sensed, or in a case where shooting is performed under flash light, image sensing cannot be performed under identical conditions in all pixels. This may eventually produce distortion in the sensed image.

To cope with this, the applicant has proposed solid-state image-sensing devices of which each pixel includes two capacitors to allow image sensing operation to be performed with identical timing in all pixels (see Japanese Patent No. 3493405 and JP-A-2004-349907). As an example of the configuration of these solid-state image-sensing devices, one that includes as the photoelectric conversion circuit the basic configuration shown in FIG. 13A is shown in FIG. 15.

The pixel shown in FIG. 15 includes, as in FIG. 14, a photodiode PD, MOS transistors T1 to T5, and a capacitor C; in addition, it further includes: a capacitor C1 that samples-and-holds the electric signal integrated by the capacitor C; an N-channel MOS transistor T100 that connects and disconnects the capacitors C and C1 to and from each other; and an N-channel MOS transistor T101 that serves as a switch for resetting the capacitor C1.

With the pixel shown in FIG. 15 configured as described above, the MOS transistor T1 to T5 and T100 operate with identical timing in all the pixels of a solid-state image-sensing device; thus the electric signals resulting from image sensing operation performed simultaneously are integrated in the capacitor C, and are then sampled-and-held in the capacitor C1. Then the MOS transistor T100 is turned off, and then horizontal and vertical scanning is performed so that image signals commensurate with the electric signals sampled-and-held in the capacitor C1 are amplified and outputted.

Specifically, immediately before the integration operation by the integrating circuit formed by the MOS transistor T2 and the capacitor C, in all pixels, the MOS transistor T5 is turned on so that the capacitor C is reset. Then the MOS transistor T5 is turned off so that a new integration period is started. Thereafter the MOS transistor T101 is turned on so that the capacitor C1 is reset, and then the MOS transistor T101 is turned off and also the MOS transistor T100 is turned on so that the voltage appearing at the capacitor C is sampled-and-held in the capacitor C1. When the MOS transistor T100 is then turned off, the integration operation in all pixels ends. In this way, image sensing operation in global shutter mode is achieved.

For the purpose of reducing dark current in solid-state image-sensing devices, there have been proposed solid-state image-sensing devices employing a buried diode (see JP-A-2006-050544). The solid-state image-sensing device disclosed in JP-A-2006-050544 includes, as shown in FIG. 16, a buried photodiode PDa that serves as a photoelectric conversion element; an N-channel MOS transistor T11 that has its source connected to the cathode of the buried photodiode PDa; an N-channel MOS transistor T12 that has its source connected to the drain of the MOS transistor T11; a MOS transistor T3 that has its gate connected to the node between the drain of the MOS transistor T11 and the source of the MOS transistor T12; and a MOS transistor T4 that has its drain connected to the source of the MOS transistor T3.

In the pixel configured as described above, as shown in FIG. 17, on a P-type substrate 30, a P-type well layer 31 is formed. In the surface of this P-type well layer 31, a P-type layer 20 is formed and an N-type buried layer 21 is buried; thus the buried photodiode PDa is formed. On the surface of a region contiguous with the region where the buried photodiode PDa is formed, a gate electrode 23 is formed with an insulating film 22 laid in between; thus a transfer gate TG is formed. In a region contiguous with the region where the transfer gate TG is formed, an N-type floating diffusion layer FD is formed. On the surface of a region contiguous with the region where the N-type floating diffusion layer FD is formed, a gate electrode 25 is formed with an insulating film 24 laid in between; thus a reset gate RG is formed. In a region contiguous with the region where the reset gate RG is formed, an N-type diffusion layer D is formed.

Here, the buried photodiode PDa has the highly-doped P-type layer 20 formed on the surface of the N-type buried layer 21. The N-type buried layer 21, the N-type floating diffusion layer FD, and the transfer gate TG together form the MOS transistor T1. The N-type floating diffusion layer FD, the N-type diffusion layer D, and the reset gate RG together form the MOS transistor T12. With the buried photodiode PDa formed in this way in the pixel, the potential at the surface of the P-type layer 20 is fixed at a potential equal to that at the channel stopper layer formed by the P-type layer around the buried photodiode PDa. The gate of the MOS transistor T3 is connected to the N-type floating diffusion layer FD.

By adopting the structure shown in FIG. 17 around the buried photodiode PDa, it is possible to suppress dark current occurring at the surface around the buried photodiode PDa, and it is thus possible to reduce dark current occurring in the pixel. In a signal output circuit provided in the stage following the pixel, correlative double sampling can be used, and thus it is also possible to eliminate kTC noise. On account of these benefits, solid-state image-sensing devices employing a buried photodiode PDa have been attracting much attention as low-noise, high-sensitivity solid-state image-sensing devices.

Moreover, in the pixel configured as shown in FIG. 17, by setting at an intermediate voltage the gate voltage at the gate electrode 23, which determines the potential state of the transfer gate TG, it is possible to switch the operation of the pixel between linear conversion operation, which yields an electric signal that varies linearly with respect to the amount of incident light, and logarithmic conversion operation, which yields an electric signal that varies logarithmically with respect to the amount of incident light. Moreover, by making the MOS transistors T11 and T12 operate simultaneously in all pixels, it is possible to hold a potential commensurate with the amount of incident light in the N-type floating diffusion layer FD simultaneously in all pixels. Thus, also with a solid-state image-sensing device of which each pixel is configured as shown in FIG. 16, image sensing operation in global shutter mode can be achieved.

A solid-state image-sensing device of which each pixel is typically configured as shown in FIG. 15 requires, compared with the configuration shown in FIG. 14, two more MOS transistors and one more capacitor. This not only increases the size per pixel but also narrows the area that can be secured for the photodiode PD, imposing limits on aperture ratio improvement and pixel size reduction. Moreover, since electric charge is transferred between the capacitors C and C1, only half of the electric charge is transferred to the capacitor C1. This reduces the amount of electric charge sampled in the capacitor C1. Furthermore, since the transfer of electric charge between the capacitors C and C1 is performed by the MOS transistor T100, noise ascribable to MOS transistor T100 may be added to the resulting signal.

On the other hand, in a solid-state image-sensing device of which each pixel is typically configured as shown in FIG. 16, so long as linear conversion operation is performed to output an image signal, the photoelectric charge generated in the photodiode PD by incident light is accumulated and, even without an integrating circuit, an integrated image signal is outputted. By contrast, when logarithmic conversion operation is performed to output an image signal, irrespective of variation in the amount of incident light during the exposure period, an image signal is outputted with the value at the moment that the MOS transistor T11 is turned off. Thus the pixel configured as shown in FIG. 16 outputs an integrated, linearly converted image signal or an unintegrated, logarithmically converted image signal. As a result, compared with the signal obtained by linear conversion operation, during which an integrated component is available, the signal obtained by logarithmic conversion operation contains large variation and is susceptible to noise.

Thus, disadvantageously, in a case where the amount of incident light is likely to vary, as in long-exposure or flashlight shooting, and in addition a logarithmically converted image signal is outputted, as when the brightness of the subject is high, it is impossible to obtain subject information accurately. Moreover, when such a logarithmically converted image signal is outputted, as the brightness of illumination light varies, flickering occurs.

SUMMARY OF THE INVENTION

An object of the present invention is to provide a CMOS-type solid-state image-sensing device that, despite having a wide dynamic range and being capable of image sensing in global shutter mode, does not require an undue increase in pixel size and offers a high S/N (signal-to-noise) ratio.

To achieve the above object, according to one aspect of the invention, a solid-state image-sensing device has a plurality of pixels each provided with: a photoelectric converter that outputs an electric signal commensurate with the amount of incident light; an integrating transistor that receives at the control electrode thereof the electric signal from the photoelectric converter; and an integrating capacitive element that has one end thereof connected to the first electrode of the integrating transistor, the integrating transistor and the integrating capacitive element together performing integration operation. Here, the pixels each further comprise: an integration operation controller controls the integration operation by the integrating transistor and the integrating capacitive element by feeding to the control electrode of the integrating transistor a control signal that turns the integrating transistor off. Moreover, preferably, in all the pixels, the integration operation controller keeps the integrating transistor on in an identical period, and, in all the pixels, the photoelectric converter performs photoelectric conversion operation and the integrating transistor and the integrating capacitive element perform the integration operation with identical timing.

In this configuration, the photoelectric converter may be provided with: a photoelectric conversion element that receives at the first electrode thereof a direct-current voltage and that generates a photoelectric charge commensurate with the amount of incident light; and a photoelectric conversion transistor that has a first electrode, a second electrode, and a control electrode, the first electrode of the photoelectric conversion transistor being connected to the second electrode of the photoelectric conversion element so that the photoelectric conversion transistor is connected in series with the photoelectric conversion element, the photoelectric conversion transistor outputting at the node between the first electrode thereof and the second electrode of the photoelectric conversion element the electric signal commensurate with the amount of incident light that is to be fed to the control electrode of the integrating transistor. In addition, the voltage fed to the control electrode of the photoelectric conversion transistor may be kept constant, and the integration operation controller may be a switching element that feeds the control signal to the control electrode of the integrating transistor. In this case, when the switching element is off, the integrating transistor operates based on the electric signal commensurate with the amount of incident light from the photoelectric conversion transistor; when the switching element is on, the control signal is fed to the integrating transistor to turn the integrating transistor off so that the integrating transistor and the integrating capacitive element are disabled from performing the integration operation.

Alternatively, the photoelectric converter may be provided with: a photoelectric conversion element that receives at the first electrode thereof a direct-current voltage and that generates a photoelectric charge commensurate with the amount of incident light; and a photoelectric conversion transistor that has a first electrode, a second electrode, and a control electrode, the first electrode of the photoelectric conversion transistor being connected to the second electrode of the photoelectric conversion element so that the photoelectric conversion transistor is connected in series with the photoelectric conversion element, the photoelectric conversion transistor outputting at the node between the first electrode thereof and the second electrode of the photoelectric conversion element the electric signal commensurate with the amount of incident light that is to be fed to the control electrode of the integrating transistor. In addition, the voltage fed to the control electrode of the photoelectric conversion transistor may be kept constant, and the photoelectric conversion transistor may also act as the integration operation controller as a result of the photoelectric conversion transistor receiving at the second electrode thereof a state switch signal that is at either a first voltage or a second voltage at a time. In this case, when the state switch signal is at the first voltage, the integrating transistor operates based on the electric signal commensurate with the amount of incident light from the photoelectric conversion transistor; when the state switch signal is at the second voltage, the control signal is fed via the photoelectric conversion transistor to the integrating transistor to turn the integrating transistor off so that the integrating transistor and the integrating capacitive element are disabled from performing the integration operation.

Alternatively, the photoelectric converter may be provided with: a photoelectric conversion element that receives at the first electrode thereof a direct-current voltage and that generates a photoelectric charge commensurate with the amount of incident light; and a photoelectric conversion transistor that has a first electrode, a second electrode, and a control electrode, the first electrode of the photoelectric conversion transistor being connected to the second electrode of the photoelectric conversion element so that the photoelectric conversion transistor is connected in series with the photoelectric conversion element, the photoelectric conversion transistor outputting at the node between the first electrode thereof and the second electrode of the photoelectric conversion element the electric signal commensurate with the amount of incident light that is to be fed to the control electrode of the integrating transistor. In addition, the photoelectric conversion transistor may also act as the integration operation controller as a result of the photoelectric conversion transistor receiving at the control electrode thereof a state switch signal that is at either a first voltage or a second voltage at a time. In this case, when the state switch signal is at the first voltage, the integrating transistor operates based on the electric signal commensurate with the amount of incident light from the photoelectric conversion transistor; when the state switch signal is at the second voltage, the control signal is fed via the photoelectric conversion transistor to the integrating transistor to turn the integrating transistor off so that the integrating transistor and the integrating capacitive element are disabled from performing the integration operation.

There may further be provided an electric charge transfer switching element that connects and disconnects the photoelectric conversion element and the photoelectric conversion transistor to and from each other. In this case, to enable the integrating transistor and the integrating capacitive element to perform the integration operation, the electric charge transfer switching element is turned on so that the photoelectric conversion element and the photoelectric conversion transistor are electrically connected to each other; to disable the integrating transistor and the integrating capacitive element from performing the integration operation, the electric charge transfer switching element is turned off so that the photoelectric conversion element and the photoelectric conversion transistor are electrically disconnected from each other.

There may further be provided a resetting switching element that forcibly discharges the photoelectric charge generated in the photoelectric conversion element to outside. In this case, when the integrating transistor and the integrating capacitive element are disabled from performing the integration operation, the resetting switching element is turned on so that the photoelectric charge generated in the photoelectric conversion element to outside is forcibly discharged to outside.

There may be provided an output signal line that is connected to the pixels and to which the pixels output electrical signals, and there may further be provided an amplifier that amplifies the electric signal appearing in the integrating capacitive element, and a read-out switch that is connected to the output signal line and that outputs the electric signal amplified by the amplifier to the output signal line.

According to the invention, a conventional pixel configuration is additionally provided with an integration operation controller for turning an integrating transistor off. The integration operation controller can stop the integration operation by the integrating transistor and an integrating capacitive element to permit the integrating capacitive element to sample-and-hold an electric signal. Thus the provision of the integration operation controller makes it possible to control the integration operation simultaneously in all the pixels of a solid-state image-sensing device so that, in each pixel, an electric signal is sampled-and-held in the integrating capacitive element and is then outputted. This makes it possible to achieve global shutter mode.

Moreover, this can be achieved simply by turning the integrating transistor on and off. This makes it possible to build the integration operation controller with a single transistor, and helps prevent an undue increase in its circuit scale. Furthermore, with the configuration including the integrating transistor and the integrating capacitive element, it is possible to absorb the noise added to the electric signal generated in the photoelectric converter, and thus to output the electric signal with a high S/N ratio.

DETAILED DESCRIPTION OF PREFERRED EMBODIMENTS

Figure 1:
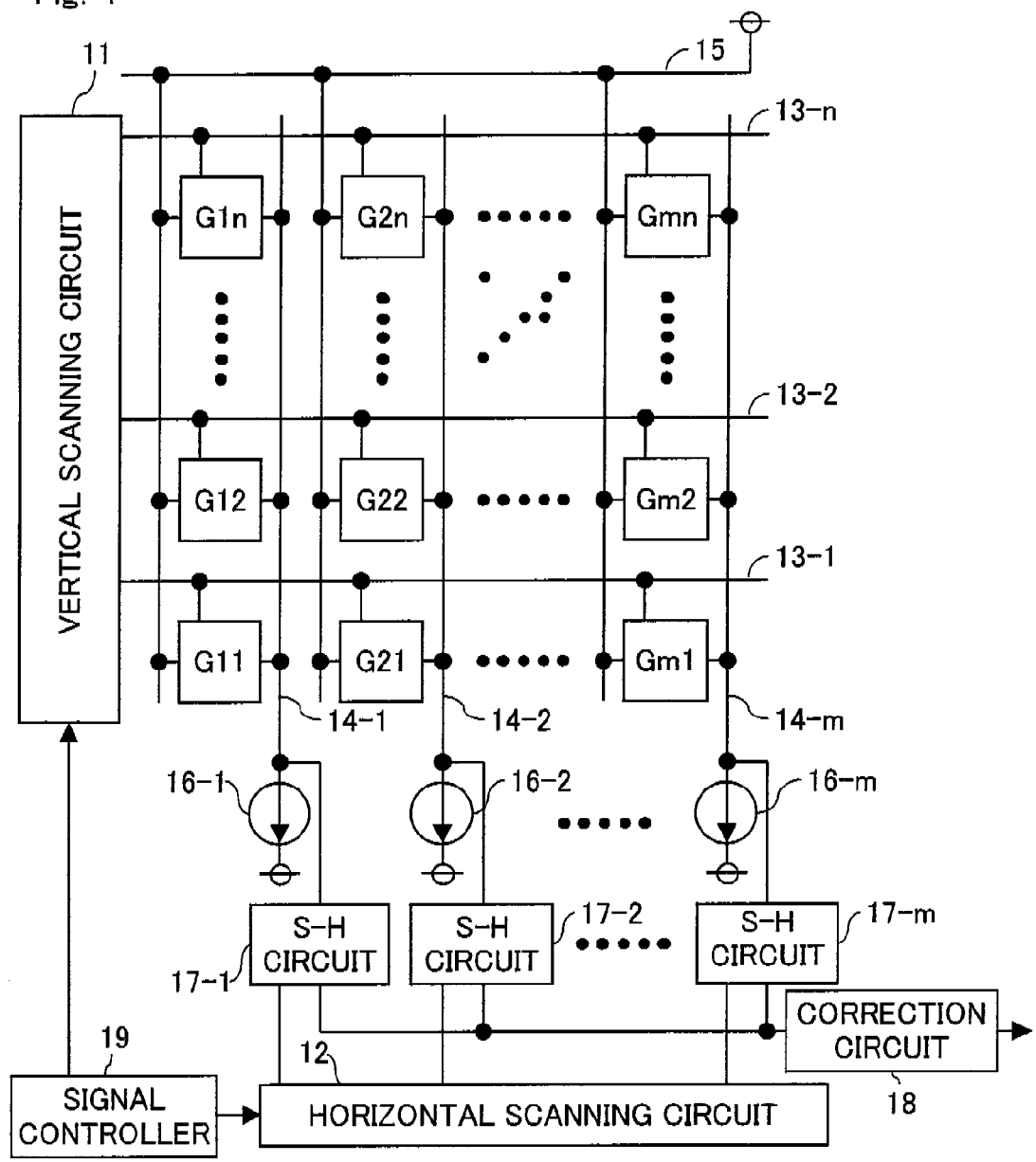
FIG. 1 is a block diagram showing the configuration of a solid-state image-sensing device common to all embodiments of the invention.

Hereinafter, embodiments of the invention will be described with reference to the accompanying drawings.
Configuration of a Solid-State Image-Sensing Device First, the configuration of a solid-state image-sensing device common to all the embodiments described later will be described with reference to FIG. 1. FIG. 1 schematically shows the configuration of part of a two-dimensional CMOS-type solid-state image-sensing device embodying the invention.

In FIG. 1, the reference signs G11 to Gmn represent pixels arrayed in rows and columns (arrayed in a matrix). The reference sign 11 represents a vertical scanning circuit, which sequentially scans rows (lines) 13-1, 13-2, . . . , 13-$n$ across which a signal $\phi V$ is fed to the pixels. The reference sign 12 represents a horizontal scanning circuit, which sequentially reads out, for one pixel after another in the horizontal direction, the photoelectric conversion signals delivered from the pixels to output signal lines 14-1, 14-2, . . . , 14-$m$. The reference sign 15 represents a supplied power line 15. In reality, the pixels are connected not only to the above-mentioned lines 13-1 to 13-$n$, output signal lines 14-1 to 14-$m$, and power line 15 but also to other lines (for example, clock lines, bias feed lines, etc.); in FIG. 1, however, these other lines are omitted from illustration.

The output signal lines 14-1 to 14-$m$ are connected to constant current sources 16-1 to 16-$m$ respectively, and are provided with sample-and-hold circuits (S-H circuits) 17-1 to 17-$m$ respectively, which sample-and-hold signals fed from the pixels G11 to Gmn across the output signal lines 14-1 to 14-$m$ respectively. When the signals sampled-and-held in the sample-and-hold circuits 17-1 to 17-$m$ are fed to a correction circuit 18, this correction circuit 18 corrects those signals and outputs noise-eliminated image signals to outside. The constant current source 16-1 to 16-$m$ receive, at their respective one ends, a direct-current voltage VPS.

In the solid-state image-sensing device configured as described above, the output signals—an image signal and a noise signal—from the pixel Gab (where "a" is a natural number fulfilling $1 \leq a \leq m$ and "b" is a natural number fulfilling $1 \leq a \leq n$) are outputted across the output signal line 14-$a$, and are amplified by the constant current source 16-$a$ connected to that output signal line 14-$a$. The image signal and noise signal outputted from the pixel Gab are, one after the other, fed to the sample-and-hold circuit 17-$a$, where, the image signal and noise signal fed thereto are sampled-and-held.

Thereafter the sample-and-hold circuit 17-$a$ feeds the sampled-and-held image signal to the correction circuit 18, and then feeds the sampled-and-held noise signal to the correction circuit 18. The correction circuit 18 corrects the image signal fed from the sample-and-hold circuit 17-$a$ based on the noise signal fed from the sample-and-hold circuit 17-$a$. Then the image signal from which noise has been eliminated based on the noise signal in the sample-and-hold circuit 17-$a$ is fed out of the solid-state image-sensing device.

In this solid-state image-sensing device, a signal controller 19 feeds the vertical scanning circuit 11 with signals based on which the vertical scanning circuit 11 outputs a signal for setting the timing with which the transfer gates of the pixels in each row are closed and signals for setting the timing with which the pixels G11 to Gmn start image sensing and output the image signal and noise signal. The signal controller 19 also feeds the horizontal scanning circuit 12 with signals based on which the horizontal scanning circuit 12 outputs signals for setting the timing with which the image signal and noise signal are outputted from the sample-and-hold circuits 17-1 to 17-m to the correction circuit 18. The signal controller 19 may be formed integrally with the solid-state image-sensing device.

Below, different embodiments of the solid-state image-sensing device configured as described above will be described. The differences among the different embodiments lie in the configuration of the pixels forming the solid-state image-sensing device; accordingly, the following description focuses on the configuration of the pixels.

First Embodiment

Figure 2:
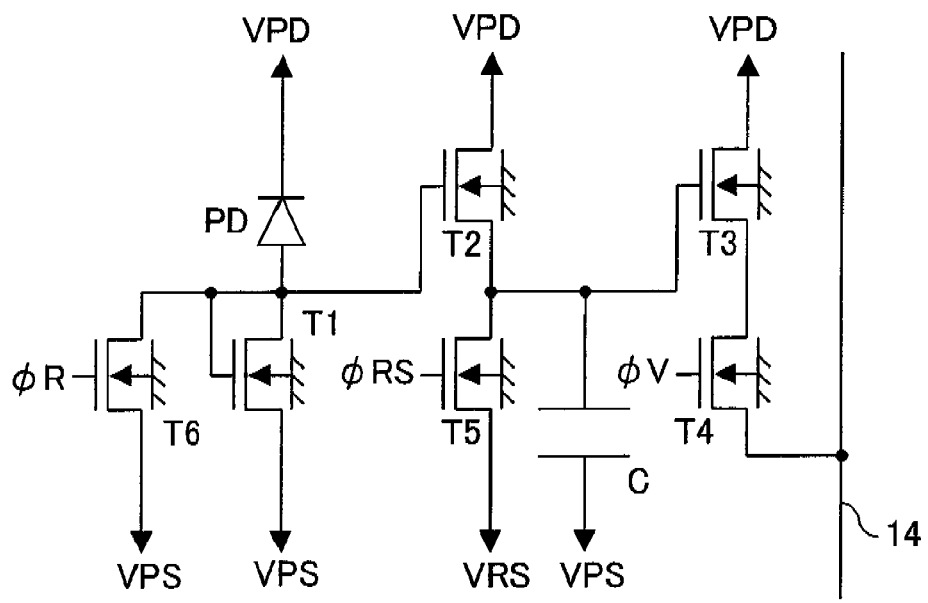
FIG. 2 is a circuit diagram showing the configuration of a pixel in the solid-state image-sensing device according to a first embodiment of the invention.

A first embodiment of the invention will be described below with reference to the relevant drawings. FIG. 2 is a diagram showing the configuration of each pixel in the solid-state image-sensing device of this embodiment. In the pixel configuration shown in FIG. 2, such parts as find their counterparts in the pixel configuration shown in FIG. 14 are identified by common reference signs, and no detailed description of such parts will be repeated.

Figure 14:
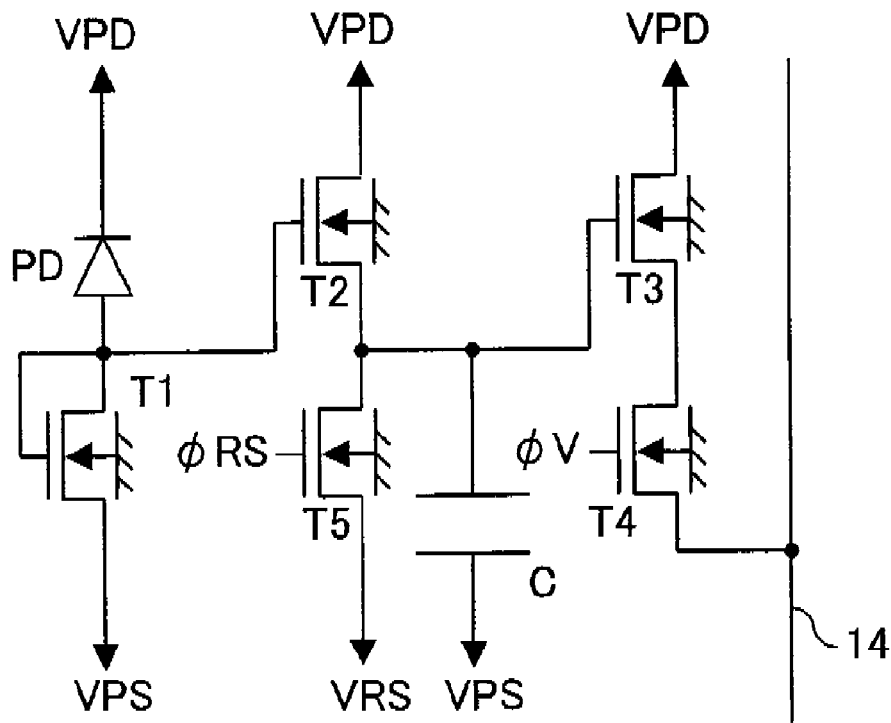
FIG. 14 is a circuit diagram showing the configuration of a pixel in a conventional solid-state image-sensing device.
Figure 15:
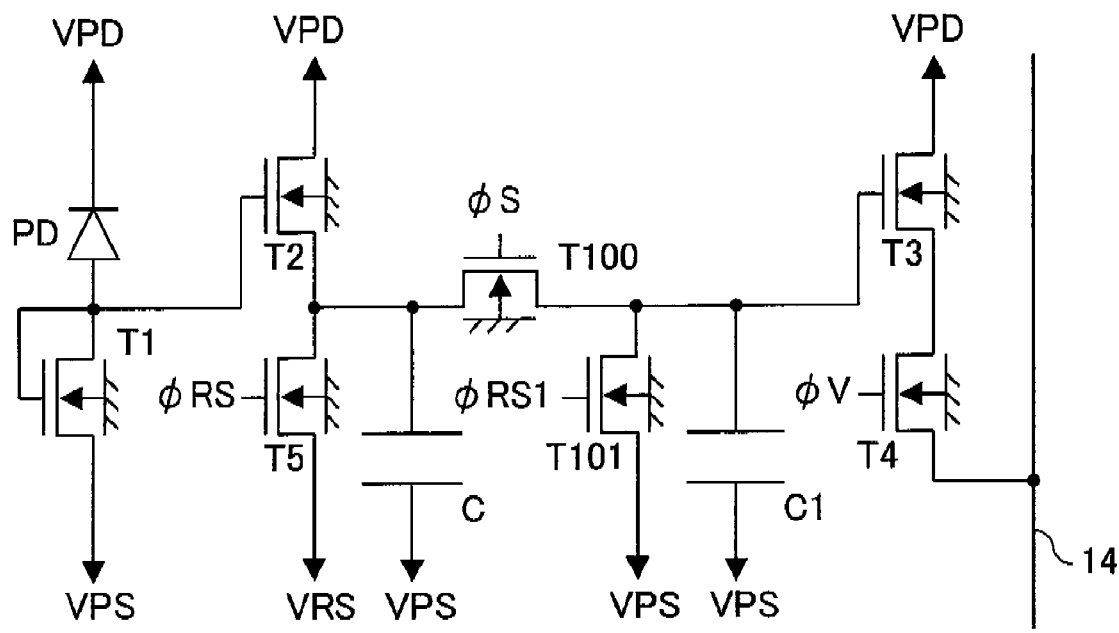
FIG. 15 is a circuit diagram showing the configuration of a pixel in a conventional solid-state image-sensing device.

Compared with the pixel configuration shown in FIG. 14, the pixel shown in FIG. 2 additionally has an N-channel MOS transistor T6 that has its drain connected to the node between the gate and the drain of the MOS transistor T1. A direct-current voltage VPD is fed to the cathode of the photodiode PD and to the drains of the MOS transistors T2 and T3, and a direct-current voltage VPS (where VPS<VPD) is fed to the drains of the MOS transistors T1 and T6 and to the other end of the capacitor C. Furthermore, a direct-current voltage VRS is fed to the source of the MOS transistor T5. In addition, signals φV, φRS, and φR are fed to the gates of the MOS transistors T4 to T6 respectively to turn them on and off. Moreover, the direct-current voltage VPS is fed to the back-gates of the N-channel MOS transistors T1 to T6.

In the pixel configured as described above, when the signal φR is at L (logically low) level and thus the MOS transistor T6 is off, if the amount of incident light is lower than a predetermined level, the MOS transistors T1 and T2 remain in a cut-off state; if the amount of incident light is higher than the predetermined level, the MOS transistors T1 and T2 operate in a sub-threshold region. Thus, at the node between the capacitor C and the gate of the MOS transistor T3, there appears a voltage equal to the integral of a value commensurate with the amount of incident light. On the other hand, when the signal φR is at H (logically high) level and thus the MOS transistor T6 is on, the voltage fed to the gate of the MOS transistor T2 is so low that the MOS transistor T2 remains off. This disables the MOS transistor T2 and the capacitor C from performing integration operation. Now the operation of the solid-state image-sensing device having its pixels configured as described above—with the MOS transistor T6 added—will be described with reference to the timing chart in FIG. 3.

In all the pixels G11 to Gmn, when image sensing is started with the signal φR at L level and the MOS transistor T6 off, a photoelectric charge commensurate with the amount of incident light is generated in the photodiode PD, causing a photoelectric current commensurate with the amount of incident light to flow through the MOS transistor T1. Here, the signals φV and φRS are also at L level, and thus the MOS transistors T4 and T5 are off. Accordingly, a voltage commensurate with the amount of incident light appears at the gates of the MOS transistors T1 and T2, and a current commensurate with the amount of incident light flows through the MOS transistor T2, with the result that the capacitor C and the MOS transistor T2 perform integration operation.

Here, if the brightness of the subject is low, since the MOS transistor T1 is in a cut-off state, the photoelectric charge is accumulated at the gate of the MOS transistor T1, and thus a voltage linearly proportional to the integral of the amount of incident light appears at the gates of the MOS transistors T1 and T2. Linear conversion operation performed in this way, the voltage appearing at the node between the capacitor C and the MOS transistor T2 is linearly proportional to the integral of the amount of incident light.

By contrast, if the brightness of the subject is high, and thus the voltage commensurate with the amount of electric charge accumulated in the gate of the MOS transistor T1 is high, then, as described above, the MOS transistors T1 and T2 operate in a sub-threshold region. Logarithmic conversion operation performed in this way, the integration operation by the capacitor C and the MOS transistor T2 makes the voltage appearing at the node between the capacitor C and the MOS transistor T2 proportional to the integral of the logarithm of the amount of incident light.

In this way, with identical timing in all the pixels G11 to Gmn, the signal φR is turned to L level, and the capacitor C is charged with a voltage commensurate with the amount of incident light; then, with identical timing in all the pixels G11 to Gmn, the signal OR is turned to H level to turn the MOS transistor T6 on. This makes the voltage fed to the gate of the MOS transistor T2 low and thus turns the MOS transistor T2 off, disabling the MOS transistor T2 and the capacitor C from performing integration operation. That is, in all the pixels G11 to Gmn, the signal φR is kept at L level in an identical period within the vertical blanking period, with the result that, in all the pixels G11 to Gmn, image sensing operation is performed simultaneously in an identical period.

Then the signal φR is turned to H level, and this ends the image sensing operation performed with identical timing in all the pixels G11 to Gmn. Subsequently, for one row after another, a H-level pulse is fed as the signal φV to the MOS transistor T4 to turn it on. This causes a current corresponding to a voltage commensurate with the integral or logarithm of the amount of incident light integrated by the capacitor C to flow through the MOS transistor T3. As a result, on the corresponding output signal line 14, there appears an image signal having a voltage commensurate with the integral or logarithm of the amount of incident light integrated.

After the feeding of the H-level pulse as the signal φV and the resulting output of the image signal, then a H-level pulse is fed as the signal φRS to the gate of the MOS transistor T5 to turn it on, thereby to reset the voltage at the node between the MOS transistor T2 and the capacitor C. Subsequently the signal φRS is turned to L level to turn the MOS transistor T5 off, and then a H-level pulse is fed as the signal φV to the MOS transistor T4 to turn it on. This causes a current commensurate with the voltage appearing at the reset capacitor C to flow through the MOS transistors T3 and T4. As a result, on the corresponding output signal line 14, there appears a noise signal having a voltage commensurate with that at the reset capacitor C.

As the image signals and noise signals are read out for one row after another in this way, as described previously, they are sampled-and-held in the sample-and-hold circuits 17-1 to 17-m. Then subtraction is performed between the image signals and noise signals thus sampled-and-held to output image signals having noise removed from them. On completion of the output of noise-eliminated image signals for all the pixels G11 to Gmn in this way, the signal φR is turned to L level in preparation for image sensing operation for the next frame; then image sensing operation with identical timing in all the pixels G11 to Gmn is started.

In this way, in this embodiment, the additionally provided MOS transistor T6 permits the MOS transistor T2 and the capacitor C to perform integration operation during the period in which the MOS transistor T6 is kept off. This makes it possible to keep the MOS transistor T6 off in an identical period in all the pixels G11 to Gmn as described above, permitting image sensing in global shutter mode.

Second Embodiment

Figure 4:
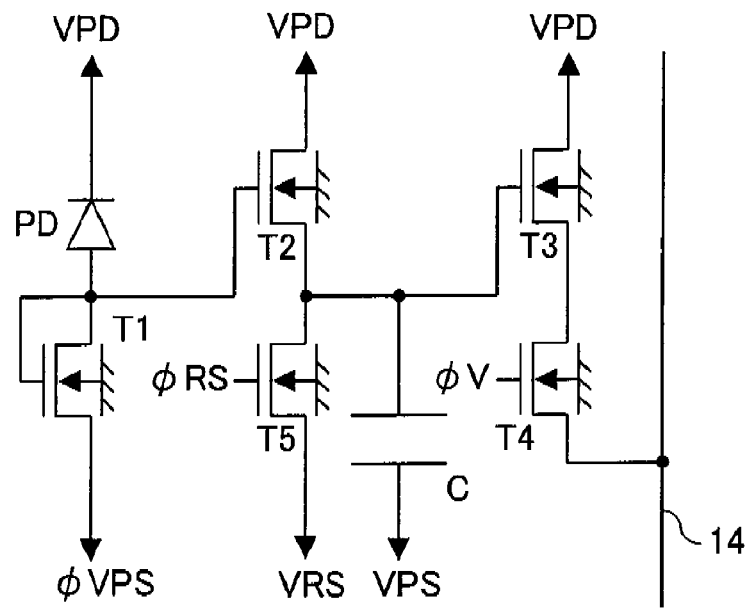
FIG. 4 is a circuit diagram showing the configuration of a pixel in the solid-state image-sensing device according to a second embodiment of the invention.

A second embodiment of the invention will be described below with reference to the relevant drawings. FIG. 4 is a diagram showing the configuration of each pixel in the solid-state image-sensing device of this embodiment. In the pixel configuration shown in FIG. 4, such parts as find their counterparts in the pixel configuration shown in FIG. 2 are identified by common reference signs, and no detailed description of such parts will be repeated.

Compared with the pixel configuration shown in FIG. 2, the pixel shown in FIG. 4 lacks the MOS transistor T6, as in the configuration shown in FIG. 14; instead, a signal φVPS is fed to the source of the MOS transistor T1. In this configuration, the signal φVPS is a binary voltage signal that is at either of the following two voltages at a time: a voltage VM that makes the MOS transistor T1 operate in a sub-threshold region when the amount of incident light is higher than a predetermined level; and a voltage VL that is lower than the voltage VM and that keeps the MOS transistor T1 in a conducting state.

Figure 5:
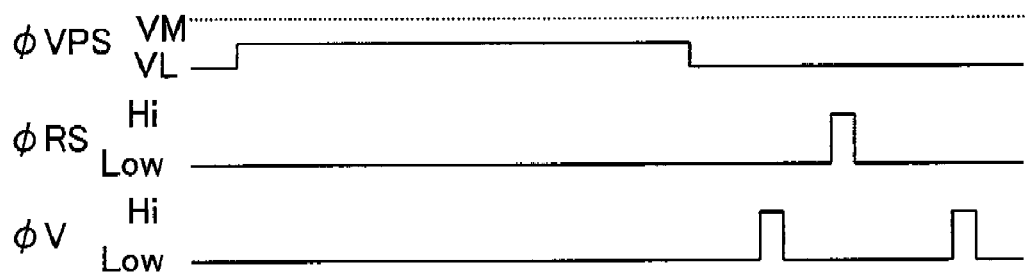
FIG. 5 is a timing chart showing the states of relevant signals in the pixel shown in FIG. 4 during image sensing.

In the pixel configured as described above, when the signal φVPS is at VM, if the amount of incident light is lower than a predetermined level, the MOS transistors T1 and T2 remain in a cut-off state; if the amount of incident light is higher than the predetermined level, the MOS transistors T1 and T2 operate in a sub-threshold region. Thus, at the node between the capacitor C and the gate of the MOS transistor T3, there appears a voltage equal to the integral of a value commensurate with the amount of incident light. On the other hand, when the signal φVPS is at VL and the MOS transistor T1 is thus in a conducting (ON) sate, the voltage fed to the gate of the MOS transistor T2 is so low that the MOS transistor T2 remains off. This disables the MOS transistor T2 and the capacitor C from performing integration operation. Now the operation of the solid-state image-sensing device having its pixels configured as described above—with the signal φVPS fed to the MOS transistor T1—will be described with reference to the timing chart in FIG. 5.

In the pixels G11 to Gmn, a photoelectric charge commensurate with the amount of incident light is generated in the photodiode PD, causing a photoelectric current commensurate with the amount of incident light to flow through the MOS transistor T1. Here, in all the pixels G11 to Gmn, the signal φVPS is turned to VM to make the MOS transistor T1 operate, thereby to start image sensing operation. Now a voltage commensurate with the amount of incident light appears at the gates of the MOS transistors T1 and T2, and a current commensurate with the amount of incident light flows through the MOS transistor T2, with the result that the capacitor C and the MOS transistor T2 perform integration operation. Meanwhile, the signals φV and φRS are kept at L level so that the MOS transistors T4 and T5 remain off.

Thus, if the brightness of the subject is low, since the MOS transistor T1 is in a cut-off state, a voltage linearly proportional to the integral of the amount of incident light appears at the node between the capacitor C and the MOS transistor T2. By contrast, if the brightness of the subject is high, since the MOS transistors T1 and T2 operate in a sub-threshold region, a voltage proportional to the integral of the logarithm of the amount of incident light appears at the node between the capacitor C and the MOS transistor T2.

In this way, with identical timing in all the pixels G11 to Gmn, the signal φVPS is turned to VM, and the capacitor C is charged with a voltage commensurate with the amount of incident light; then, with identical timing in all the pixels G11 to Gmn, the signal φVPS is turned to VL to turn the MOS transistor T1 on. This makes the voltage fed to the gate of the MOS transistor T2 low and thus turns the MOS transistor T2 off, disabling the MOS transistor T2 and the capacitor C from performing integration operation. That is, in all the pixels G11 to Gmn, the signal φVPS is kept at VM in an identical period within the vertical blanking period, with the result that, in all the pixels G11 to Gmn, image sensing operation is performed simultaneously in an identical period.

On completion of this image sensing operation performed with identical timing in all the pixels G11 to Gmn, as in the first embodiment, for one row after another, the image signal and noise signal are outputted. Specifically, first, a H-level pulse is fed as the signal φV to the MOS transistor T4 to turn it on so that, as an image signal, a voltage signal is outputted to the output signal line 14. Then a H-level pulse is fed as the signal φRS to the gate of the MOS transistor T5 to reset the voltage at the node between the MOS transistor T2 and the capacitor C. Thereafter a H-level pulse is fed as the signal φV to the MOS transistor T4 again to turn it on so that a noise signal having a value commensurate with the voltage at the reset capacitor C is outputted to the output signal line 14.

In this way, in this embodiment, the signal φVPS is fed to the source of the MOS transistor T1 so that, during the period in which the signal φVPS is kept at VM, the MOS transistor T2 and the capacitor C perform integration operation. Thus, as described above, the signal φVPS is kept at VM in an identical period in all the pixels G11 to Gmn, and this permits image sensing in global shutter mode. Moreover, in this embodiment, compared with the first embodiment, the MOS transistor T6 is omitted, and this helps reduce the circuit scale of the pixel.

Third Embodiment

Figure 6:
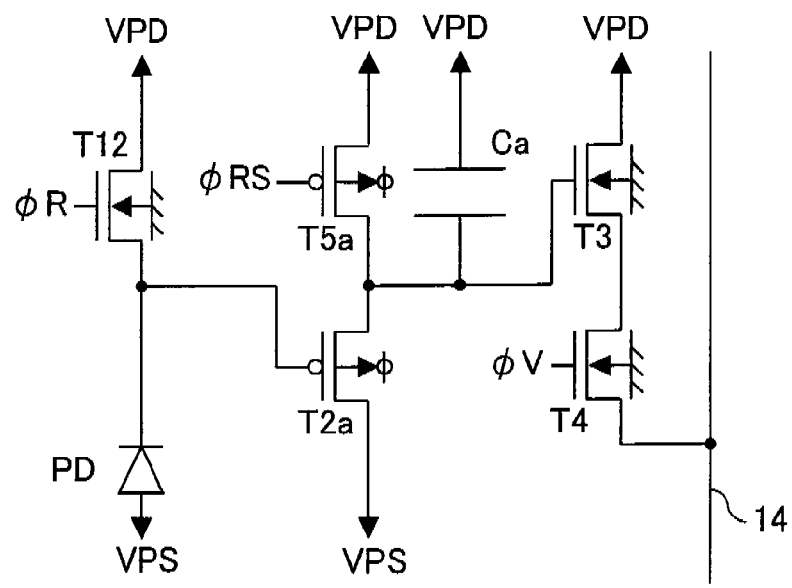
FIG. 6 is a circuit diagram showing the configuration of a pixel in the solid-state image-sensing device according to a third embodiment of the invention.

A third embodiment of the invention will be described below with reference to the relevant drawings. FIG. 6 is a diagram showing the configuration of each pixel in the solid-state image-sensing device of this embodiment. In the pixel configuration shown in FIG. 6, such parts as find their counterparts in the pixel configuration shown in FIG. 16 are identified by common reference signs, and no detailed description of such parts will be repeated.

Figure 16:
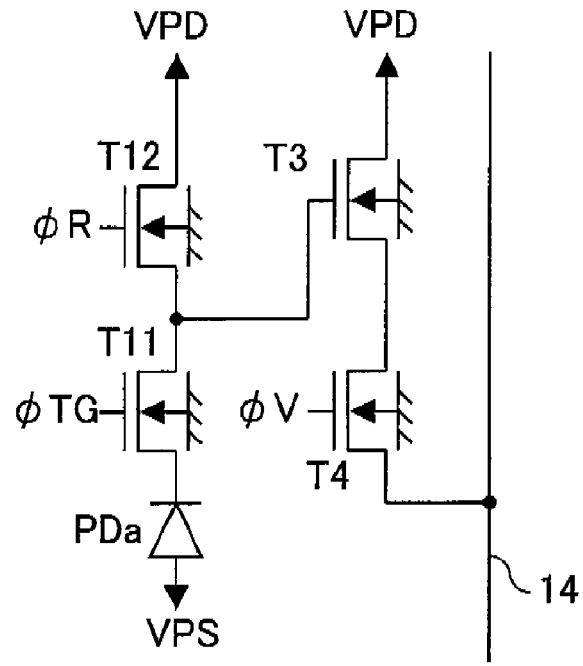
FIG. 16 is a circuit diagram showing the configuration of a pixel in a conventional solid-state image-sensing device.
Figure 17:
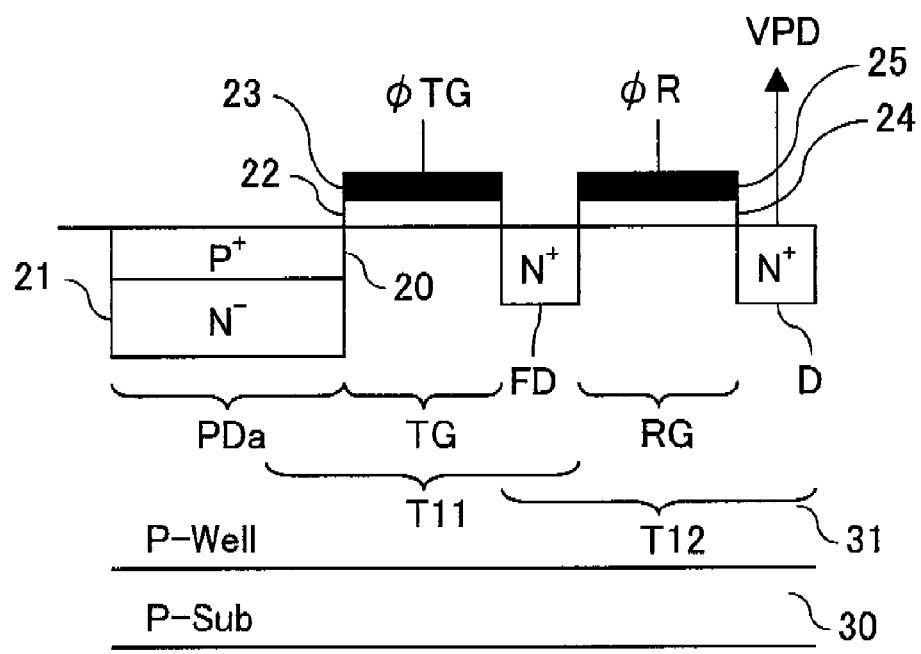
FIG. 17 is a schematic structure diagram showing the structure around a buried photodiode in the pixel configured as shown in FIG. 16.

Compared with the pixel configuration shown in FIG. 16, the pixel shown in FIG. 6 has, instead of the buried photodiode PDa, a photodiode PD; moreover, the MOS transistor T1 is omitted, and instead there are additionally provided: a P-channel MOS transistor T2a that has its gate connected to the node between the cathode of the photodiode PD and the source of the MOS transistor T12; a P-channel MOS transistor T5a that has its drain connected to the source of the MOS transistor T2a; and a capacitor Ca of which one end is connected to the node between the source of the MOS transistor T2a and the drain of the MOS transistor T5a.

A direct-current voltage VPS is fed to the anode of the photodiode PD and to the drain of the MOS transistor T2a, and a direct-current voltage VPD (where VPD>VPS) is fed to the drains of the MOS transistors T12 and T3, to the other end of the capacitor Ca, and to the source of the MOS transistor T5a. In addition, signals φV, φRS, and φR are fed to the gates of the MOS transistors T4, T5a, and T12 respectively to turn them on and off and to control their operation states.

Here, the signal φR fed to the gate of the MOS transistor T12 is a binary voltage signal that is at either of the following two voltages at a time: a voltage Vm that makes the MOS transistor T12 operate in a sub-threshold region when the amount of incident light is higher than a predetermined level; and a voltage Vh that is higher than the voltage Vm and that keeps the MOS transistor T12 in a conducting state. Furthermore, the direct-current voltage VPS is fed to the backgates of the MOS transistors T1, T3, T4, and T12, and the direct-current voltage VPD is fed to the backgates of the MOS transistors T2a and T5a.

Figure 7:
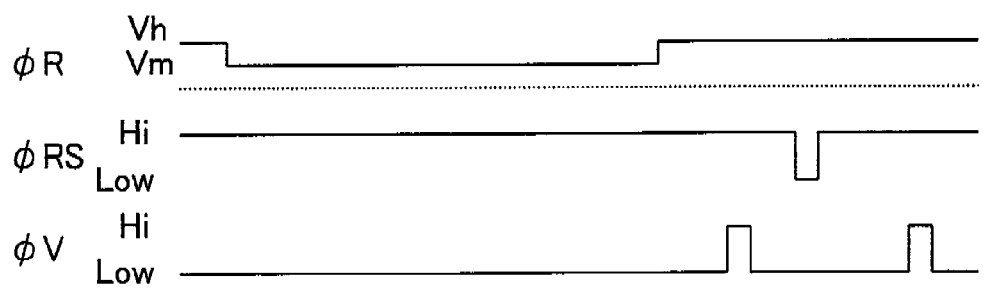
FIG. 7 is a timing chart showing the states of relevant signals in the pixel shown in FIG. 6 during image sensing.

In the pixel configured as described above, when the signal φR is at Vm, if the amount of incident light is lower than a predetermined level, the MOS transistor T12 remains in a cut-off state; if the amount of incident light is higher than the predetermined level, the MOS transistor T12 operates in a sub-threshold region. Thus, at the gate of the MOS transistor T2a, there appears a voltage commensurate with the amount of incident light, and accordingly, at the node between the capacitor Ca and the gate of the MOS transistor T3, there appears a voltage equal to the integral of a value commensurate with the amount of incident light. On the other hand, when the signal φR is at Vh and thus the MOS transistor T12 is in a conducting (ON) state, the voltage fed to the gate of the MOS transistor T2a is so high as to turn the MOS transistor T2a off, disabling the MOS transistor T2a and the capacitor Ca from performing integration operation. Now the operation of the solid-state image-sensing device having its pixels configured as described above will be described with reference to the timing chart in FIG. 7.

In the pixels G11 to Gmn, a photoelectric charge commensurate with the amount of incident light is generated in the photodiode PD, causing a photoelectric current commensurate with the amount of incident light to flow through the MOS transistor T12. Here, in all the pixels G11 to Gmn, the signal φR is turned to Vm to make the MOS transistor T12 operate, thereby to start image sensing operation. Now a voltage commensurate with the amount of incident light appears at the gate of the MOS transistor T2a, and a current commensurate with the amount of incident light flows through the MOS transistor T2a, with the result that the capacitor Ca and the MOS transistor T2a perform integration operation. Meanwhile, the signal φV is kept at L level and the signal φRS at H level so that the MOS transistors T4 and T5a remain off.

As a result of the operation described above, as in the first and second embodiments, if the brightness of the subject is low, since the MOS transistor T12 is in a cut-off state, a voltage linearly proportional to the integral of the amount of incident light appears at the node between the capacitor Ca and the MOS transistor T2a. By contrast, if the brightness of the subject is high, since the MOS transistor T12 operates in a sub-threshold region, a voltage proportional to the integral of the logarithm of the amount of incident light appears at the node between the capacitor Ca and the MOS transistor T2a.

Specifically, if the brightness of the subject is low, the photoelectric charge generated in the photodiode PD is accumulated at the gate of the MOS transistor T2a, and thus the gate voltage of the MOS transistor T2a has a value based on the accumulated photoelectric charge, that is, a value linearly proportional to the integral of the amount of incident light. By contrast, if brightness of the subject is high, the amount of photoelectric charge accumulated at the gate of the MOS transistor T2a is so large that the gate voltage of the MOS transistor T2a is close to the gate voltage Vm of the MOS transistor T12, and this makes the MOS transistor T12 operate in a sub-threshold region.

Thus, if the brightness of the subject is low, a current that varies linearly with respect to the amount of incident light flows through the MOS transistor T2a, and a voltage that varies linearly with respect to the integral of the amount of incident light appears at the capacitor Ca. By contrast, if the brightness of the subject is high, a current that varies natural-logarithmically with respect to the amount of incident light flows through the MOS transistor T2a, and a voltage that varies natural-logarithmically with respect to the integral of the amount of incident light appears at the capacitor Ca. In this embodiment, the voltage appearing at the node between the MOS transistor T2a and the capacitor Ca drops by a value commensurate with the time-integral of the photoelectric current flowing through the MOS transistor T12.

In this way, with identical timing in all the pixels G11 to Gmn, the signal φR is turned to Vm so that a voltage commensurate with the amount of incident light is sampled-and-held in the capacitor Ca; then, with identical timing in all the pixels G11 to Gmn, the signal φR is turned to Vh to turn the MOS transistor T12 on. This makes the voltage fed to the gate of the MOS transistor T2a high and thus turns the MOS transistor T2a off, disabling the MOS transistor T2a and the capacitor Ca from performing integration operation. That is, in all the pixels G11 to Gmn, the signal φR is kept at Vm in an identical period within the vertical blanking period, with the result that, in all the pixels G11 to Gmn, image sensing operation is performed simultaneously in an identical period.

On completion of this image sensing operation performed with identical timing in all the pixels G11 to Gmn, as in the first embodiment, for one row after another, the image signal and noise signal are outputted. Specifically, first, a H-level pulse is fed as the signal φV to the MOS transistor T4 to turn it on so that, as an image signal, a voltage signal is outputted to the output signal line 14. Then a L-level pulse is fed as the signal φRS to the gate of the MOS transistor T5a to turn it on, thereby to reset the voltage at the node between the MOS transistor T2a and the capacitor Ca.

Thereafter the signal φRS is turned back to H level to turn the MOS transistor T5a off, and then a H-level pulse is fed as the signal φV to the MOS transistor T4 again to turn it on so that a noise signal having a value commensurate with the voltage at the reset capacitor Ca is outputted to the output signal line 14. Here, when the MOS transistor T5a turns off, the MOS transistor T2a first operates in a saturated state, and thus the voltage at the node between the MOS transistor T2a and the capacitor Ca starts to fall; then the MOS transistor T2a operates in a sub-threshold region, and thus the voltage at the node between the MOS transistor T2a and the capacitor Ca gradually falls, aiming at the voltage that brings the MOS transistor T2a into a cut-off state.

Specifically, until the difference between the voltage at the cathode of the photodiode PD and the voltage at the node between the MOS transistor T2a and the capacitor Ca exceeds the threshold voltage of the MOS transistor T2a, the MOS transistor T2a can pass a large current. Thus the voltage appearing at the node between the capacitor Ca and the drain of the MOS transistor T2a falls in accordance with the variation in the threshold voltage of the MOS transistor T2a. Thus, when a H-level pulse fed as the signal φV to the MOS transistor T4 turns it on, a noise signal containing the variation component in the threshold voltage of the MOS transistor T2a is outputted.

In this way, in this embodiment, the signal φR is fed to the gate of the MOS transistor T12 so that, during the period in which the signal φR is kept at Vm, the MOS transistor T2a and the capacitor Ca perform integration operation. That is, as described above, the signal φR is kept at Vm in an identical period in all the pixels G11 to Gmn, and this permits image sensing in global shutter mode. Moreover, in this embodiment, the number of MOS transistors required is the same as in the second embodiment, and this helps reduce the circuit scale of the pixel compared with the first embodiment. Moreover, the provision of the integrating circuit formed by the MOS transistor T2a and the capacitor Ca makes it possible to absorb variations in signals during logarithmic conversion, and thereby to reduce the influence of noise.

In the first to third embodiments, noise signals are outputted by performing resetting row by row. The output of noise signals may be done subsequently to the output of image signals row by row, or the output of noise signals may be done row by row after the output of the image signals of all the rows. It is possible even to omit the reading-out of noise signals and perform the resetting by the MOS transistors T5 and T5a simultaneously in all the pixels G11 to Gmn.

Fourth Embodiment

Figure 8:
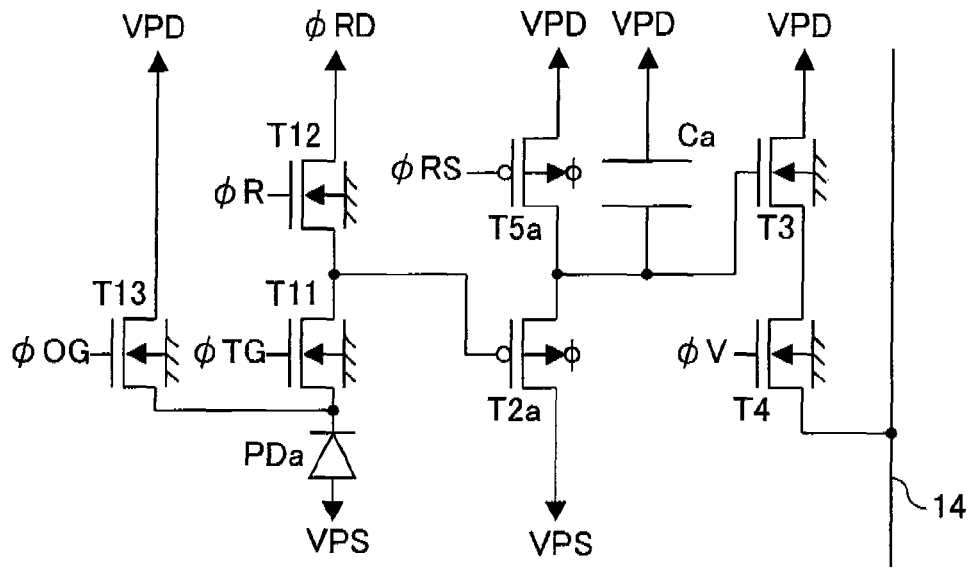
FIG. 8 is a circuit diagram showing the configuration of a pixel in the solid-state image-sensing device according to a fourth embodiment of the invention.

A fourth embodiment of the invention will be described below with reference to the relevant drawings. FIG. 8 is a diagram showing the configuration of each pixel in the solid-state image-sensing device of this embodiment. In the pixel configuration shown in FIG. 8, such parts as find their counterparts in the pixel configuration shown in FIG. 6 are identified by common reference signs, and no detailed description of such parts will be repeated.

Compared with the pixel configuration shown in FIG. 6, the pixel shown in FIG. 8 has, instead of the photodiode PD, a buried photodiode PDa, and a direct-current voltage VPS is fed to the anode of this buried photodiode PDa; moreover, there are additionally provided: a MOS transistor T11 that has its source connected to the cathode of the buried photodiode PDa and that has its drain connected to the source of the MOS transistor T12; and an N-channel MOS transistor T13 that has its source connected to the node between the cathode of the buried photodiode PDa and the source of the MOS transistor T11. The MOS transistor T11 here is the same as in the pixel configuration shown in FIG. 16.

Moreover, a direct-current voltage VPD is fed to the drain of the transistor T13, and a signal φRD is fed to the drain of the MOS transistor T12. Furthermore, the direct-current voltage VPD is fed to the backgates of the MOS transistors T11 and T13. In addition, signals φTG and φOG are fed to the gates of the MOS transistors T11 and T13 to turn them on and off and to control their operation states.

First Example of Operation

Figure 9:
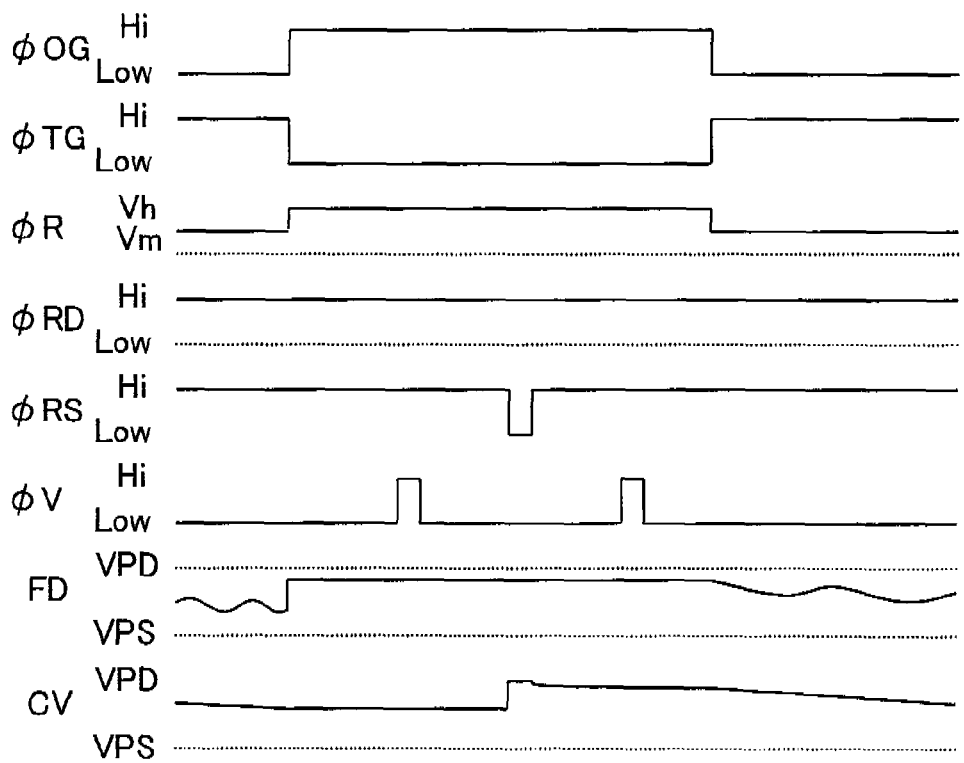
FIG. 9 is a timing chart showing the states of relevant signals in the pixel shown in FIG. 8 during image sensing, according to a first example of operation.

A first example of the operation of the solid-state image-sensing device having its pixels configured as described above will be described below with reference to the timing chart in FIG. 9. In this example of operation, the signal φRD is kept at H level throughout so that a constant voltage VPD is fed to the drain of the MOS transistor T12.

In all the pixels G11 to Gmn, the signal φOG is turned to L level to turn the transistor T13 off, the signal φTG is turned to H level to turn the MOS transistor T11 on, and the signal φR is turned to Vm to make the MOS transistor T12 operate, thereby to start image sensing operation. This causes the cathode of the buried photodiode PDa to be connected via the MOS transistor T11 to the drain of the MOS transistor T12, and a voltage commensurate with the amount of incident light appears at the gate of the MOS transistor T2a. Thus a current commensurate with the amount of incident light flows through the MOS transistor T2a, enabling the capacitor Ca and the MOS transistor T2a to perform integration operation. Meanwhile, the signal φV is kept at L level and the signal φRS at H level so that the MOS transistors T4 and T5a remain off.

As a result of the operation described above, as in the third embodiment, if the brightness of the subject is low, since the MOS transistor T12 is in a cut-off state, a voltage linearly proportional to the integral of the amount of incident light appears at the node between the capacitor Ca and the MOS transistor T2a. By contrast, if the brightness of the subject is high, since the MOS transistor T12 operates in a sub-threshold region, a voltage proportional to the integral of the logarithm of the amount of incident light appears at the node between the capacitor Ca and the MOS transistor T2a.

In this way, with identical timing in all the pixels G11 to Gmn, the signals φOG and φTG are turned to L and H levels respectively and the signal φR to Vm to start image sensing operation so that a voltage commensurate with the amount of incident light is sampled-and-held in the capacitor Ca; then, with identical timing in the all the pixels G11 to Gmn, the signals φOG and φTG are turned to H and L levels respectively and the signal φR to Vh.

Specifically, the MOS transistor T11 is turned off so that the cathode of the buried photodiode PDa is electrically disconnected from the gate of the MOS transistor T2a, and the transistor T13 is turned on so that the photoelectric charge generated in the buried photodiode PDa is discharged. Moreover, the MOS transistor T12 is turned on to turn, as in the third embodiment, the MOS transistor T2a off so that the MOS transistor T2a and the capacitor Ca are disabled from performing integration operation and the electric charge accumulated in the capacitor Ca is held there. In this way, in all the pixels G11 to Gmn, the signal φR is kept at Vm and the signals φTG and φOG at H and L levels respectively in an identical period within the vertical blanking period, with the result that, in all the pixels G11 to Gmn, image sensing operation is performed simultaneously in an identical period.

On completion of this image sensing operation performed with identical timing in all the pixels G11 to Gmn, as in the third embodiment, for one row after another, the image signal and noise signal are outputted. Specifically, first, a H-level pulse is fed as the signal φV to the MOS transistor T4 to turn it on so that, as an image signal, a voltage signal is outputted to the output signal line 14. Then a L-level pulse is fed as the signal φRS to the gate of the MOS transistor T5a to turn it on, thereby to reset the voltage at the node between the MOS transistor T2a and the capacitor Ca. Thereafter the signal φRS is turned back to H level to turn the MOS transistor T5a off, and then a H-level pulse is fed as the signal φV to the MOS transistor T4 again to turn it on so that a noise signal having a value commensurate with the voltage at the reset capacitor Ca is outputted to the output signal line 14.

Specifically, until the difference between the voltage at the drain (floating diffusion layer FD) of the MOS transistor T11 and the voltage at the node between the MOS transistor T2a and the capacitor Ca exceeds the threshold voltage of the MOS transistor T2a, the MOS transistor T2a can pass a large current. Thus the voltage CV appearing at the node between the capacitor Ca and the drain of the MOS transistor T2a falls in accordance with the variation in the threshold voltage of the MOS transistor T2a. Thus, when a H-level pulse fed as the signal φV to the MOS transistor T4 turns it on, a noise signal containing the variation component in the threshold voltage of the MOS transistor T2a is outputted.

Second Example of Operation

Figure 10:
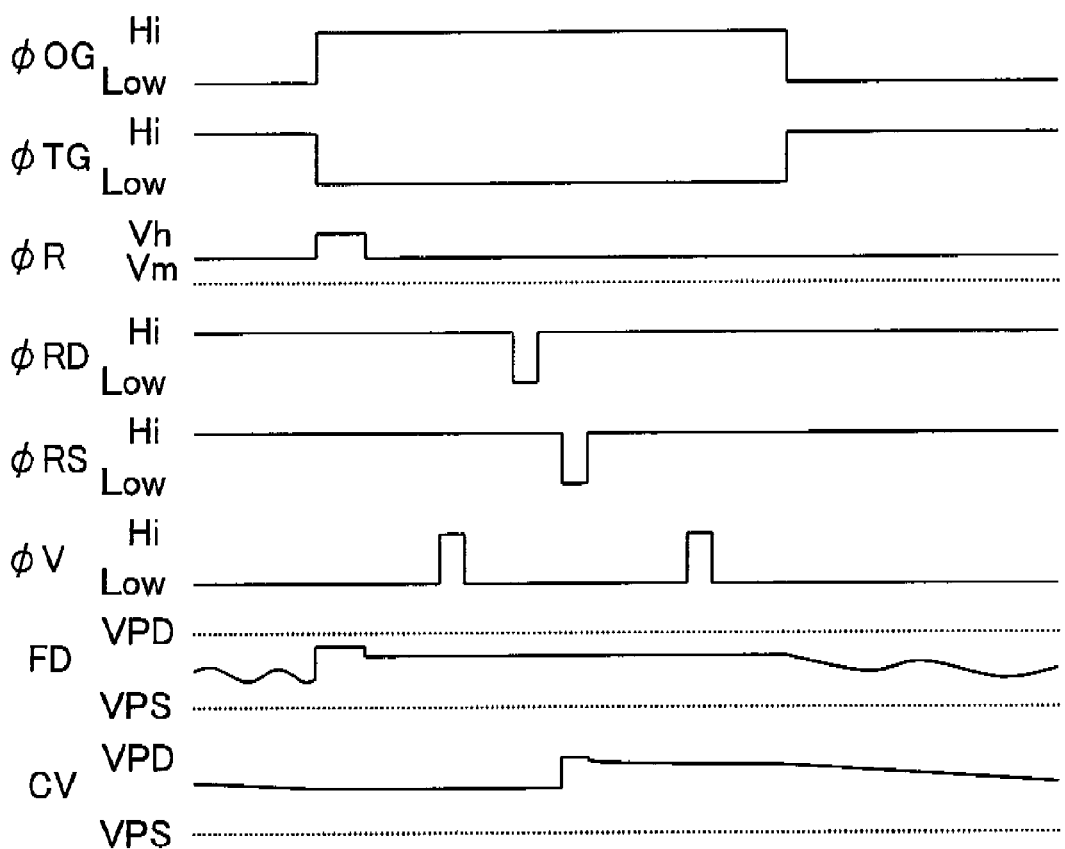
FIG. 10 is a timing chart showing the states of relevant signals in the pixel shown in FIG. 8 during image sensing, according to a second example of operation.

A second example of the operation of the solid-state image-sensing device having its pixels configured as described above will be described below with reference to the timing chart in FIG. 10. In this example of operation, as distinct from the first, there is provided a period in which the signal φRD is kept at L level. In regard of such states in this example of operation as find their counterparts in the first example of operation, no detailed description will be repeated.

In this example of operation, as in the first example of operation, in all the pixels G11 to Gmn, the signal φOG is turned to L level to turn the transistor T13 off, and the signal φTG is turned to H level to turn the MOS transistor T11 on, thereby to start image sensing operation. Meanwhile, the signal φV is kept at L level and the signal φRS at H level so that the MOS transistors T4 and T5a remain off. Moreover, the signal φR is kept at Vm to make the MOS transistor T12 operate, and the signal φRD is kept at H level to feed the direct-current voltage VPD to the drain of the MOS transistor T12.

In this way, with identical timing in all the pixels G11 to Gmn, the signals φOG and φTG are turned to L and H levels respectively to start image sensing operation so that a voltage commensurate with the amount of incident light is sampled-and-held in the capacitor Ca; then, with identical timing in all the pixels G11 to Gmn, the signals φOG and φTG are turned to H and L levels respectively and the signal φR to Vh to end image sensing operation. Thereafter, in all the pixels G11 to Gmn, the signal φR is turned back to Vm immediately, but, since the MOS transistor T11 is off, the photoelectric charge generated in the buried photodiode PDa does not flow to the node (floating diffusion layer FD) between the source of the MOS transistor T12 and the drain of the MOS transistor T1. Moreover, since this floating diffusion layer FD is in a floating state, the variation in the voltage there is small.

Thus the MOS transistors T2a and T5a turn off, thus the MOS transistor T2a and the capacitor Ca are disabled from performing integration operation, and the electric charge accumulated in the capacitor Ca is held there. Thereafter, as in the first example of operation described above, for one row after another, the image signal and noise signal are outputted. Specifically, first, a H-level pulse is fed as the signal φV to the MOS transistor T4 to turn it on so that, as an image signal, a voltage signal is outputted to the output signal line 14.

Thereafter the signal φRD is turned from H level to L level to lower the direct-current voltage fed to the drain of the MOS transistor T12. This causes the voltage at the floating diffusion layer FD to lower in accordance with the threshold value of the MOS transistor T12. That is, the variation in the threshold value of the MOS transistor T12 operating in a sub-threshold region is reflected in the voltage at the floating diffusion layer FD. When the voltage at the floating diffusion layer FD then settles in a steady state, the signal φRD is turned from L level to H level so that the direct-current voltage VPD is fed to the drain of the MOS transistor T12.

Here, with the gate of the MOS transistor T2a connected to the floating diffusion layer FD, until the difference between the voltage at the floating diffusion layer FD and the voltage at the node between the MOS transistor T2a and the capacitor Ca exceeds the threshold voltage of the MOS transistor T2a, the MOS transistor T2a can pass a large current. Thus, the voltage CV appearing at the node between the capacitor Ca and the drain of the MOS transistor T2a falls in accordance with the variation in the threshold voltage of the MOS transistor T2a.

This makes the voltage sampled-and-held at the node between the capacitor Ca and the drain of the MOS transistor T2a commensurate with the threshold voltage of the MOS transistors T12 and T2a. Thus, when the signal φRD is turned from L level to H level and then a H-level pulse is fed as the signal φV to the MOS transistor T4 to turn it on, a noise signal containing the variation component in the threshold voltage of the MOS transistors T12 and T2a is outputted.

Fifth Embodiment

Figure 11:
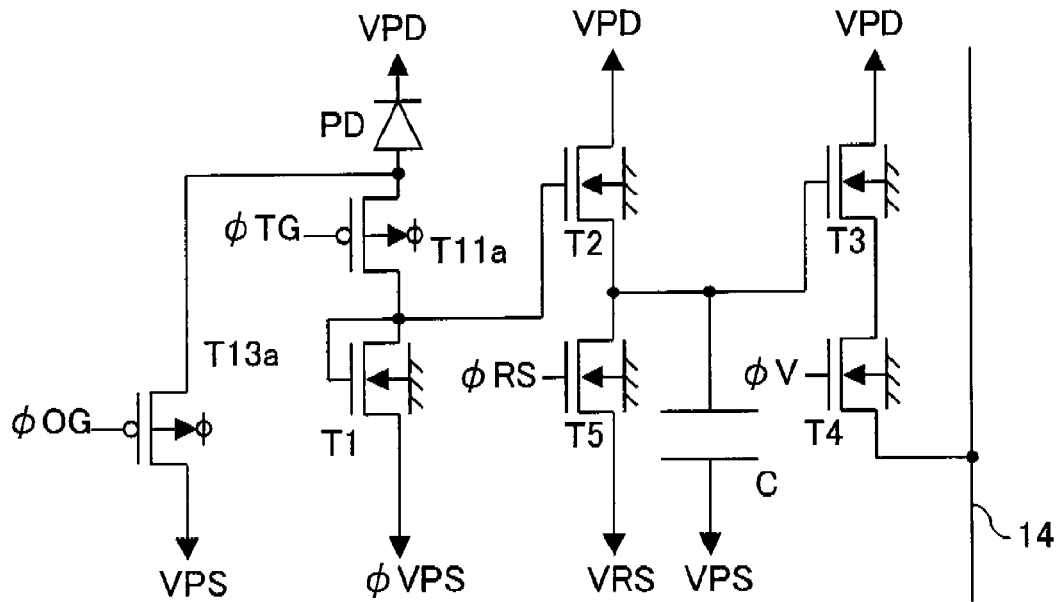
FIG. 11 is a circuit diagram showing the configuration of a pixel in the solid-state image-sensing device according to a fifth embodiment of the invention.

A fifth embodiment of the invention will be described below with reference to the relevant drawings. FIG. 11 is a diagram showing the configuration of each pixel in the solid-state image-sensing device of this embodiment. In the pixel configuration shown in FIG. 11, such parts as find their counterparts in the pixel configuration shown in FIG. 3 are identified by common reference signs, and no detailed description of such parts will be repeated.

Figure 3:
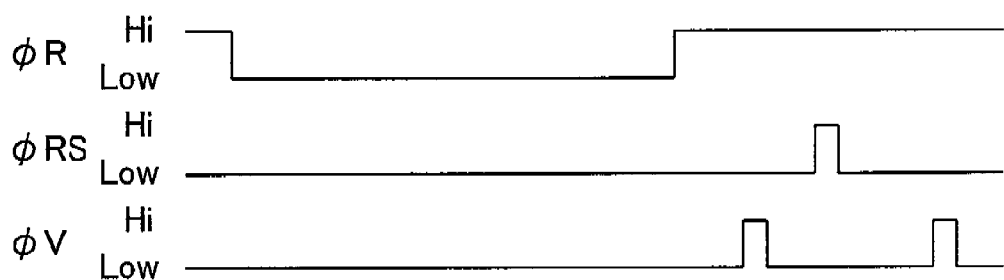
FIG. 3 is a timing chart showing the states of relevant signals in the pixel shown in FIG. 2 during image sensing.

Compared with the pixel configuration shown in FIG. 3, the pixel shown in FIG. 11 further has: a P-channel MOS transistor T11a that has its source connected to the anode of the photodiode PD and that has its drain connected to the gate and drain of the MOS transistor T1; and a P-channel MOS transistor T13a that has its source connected to the node between the anode of the photodiode PD and the source of the MOS transistor T11a. In addition, signals φTG and φOG are fed to the gates of the MOS transistors T11a and T13a respectively to turn them on and off and to control their operation states. Moreover, a direct-current voltage VPS is fed to the drain of the MOS transistor T13a, and a direct-current voltage VPS is fed to the backgates of the MOS transistors T11a and T13a.

Figure 12:
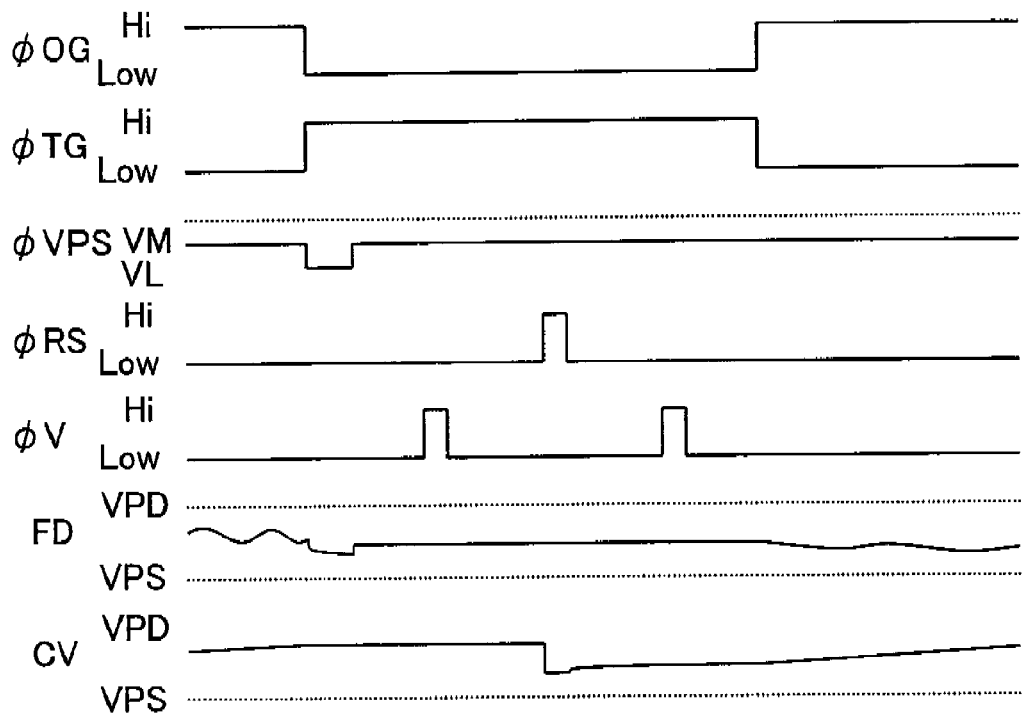
FIG. 12 is a timing chart showing the states of relevant signals in the pixel shown in FIG. 11 during image sensing.
Figure 13A:
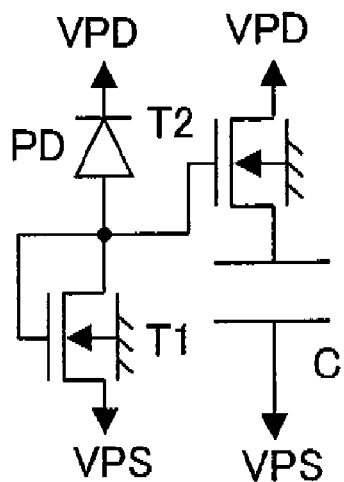
FIGS. 13A and 13B are each a circuit diagram showing a basic circuit of a photoelectric conversion portion in a pixel in a conventional solid-state image-sensing device.
Figure 13B:
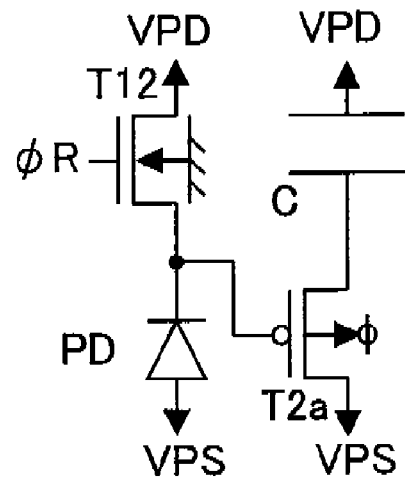

Now the operation of the solid-state image-sensing device having its pixels configured as described above will be described with reference to the timing chart in FIG. 12. In all the pixels G11 to Gmn, the signal φOG is turned to H level to turn the MOS transistor T13a off, and the signal φTG is turned to L level to turn the MOS transistor T11a on, thereby to start image sensing operation. Meanwhile, the signals φV and φRS are kept low so that the MOS transistors T4 and T5 remain off. Here, when the signal φVPS is turned to VM to make the MOS transistor T1 operate, a photoelectric charge commensurate with the amount of incident light is generated in the photodiode PD, and a photoelectric current commensurate with the amount of incident light flows through the MOS transistor T1.

Specifically, as in the second embodiment, if the brightness of the subject is low, since the MOS transistor T1 is in a cut-off state, a voltage linearly proportional to the integral of the amount of incident light appears at the node between the capacitor C and the MOS transistor T2. By contrast, if the brightness of the subject is high, since the MOS transistors T1 and T2 operate in a sub-threshold region, a voltage CV proportional to the integral of the logarithm of the amount of incident light appears at the node between the capacitor C and the MOS transistor T2.

In this way, with identical timing in all the pixels G11 to Gmn, the signals φOG and φTG are turned to H and L levels respectively to start image sensing operation so that a voltage commensurate with the amount of incident light is accumulated in the capacitor C; then, with identical timing in all the pixels G11 to Gmn, the signals φOG and φTG are turned to L and H levels respectively to turn the MOS transistor T13a on and the MOS transistor T11a off, and in addition the signal φVPS is turned to VL to turn the MOS transistor T1 on.

Specifically, the MOS transistor T11a is turned off so that the anode of the photodiode PD is electrically disconnected from the gate and source of the MOS transistor T1, and the transistor T13a is turned on so that the photoelectric charge generated in the photodiode PD is discharged. Moreover, the MOS transistor T1 is turned on to turn, as in the second embodiment, the MOS transistor T2 off so that the MOS transistor T2 and the capacitor C are disabled from performing integration operation and the electric charge accumulated in the capacitor C is held there.

Thereafter, in all the pixels G11 to Gmn, the signal φVPS is turned back to VM immediately, but, as in the second example of operation in the fourth embodiment, since the MOS transistor T11a is off, the photoelectric charge generated in the photodiode PD does not flow to the node (floating diffusion layer FD) between the source and gate of the MOS transistor T1. Moreover, since this floating diffusion layer FD is in a floating state, the variation in the voltage there is small.

On completion of this image sensing operation performed with identical timing in all the pixels G11 to Gmn, as in the second embodiment, for one row after another, the image signal and noise signal are outputted. Specifically, first, a H-level pulse is fed as the signal φV to the MOS transistor T4 to turn it on so that, as an image signal, a voltage signal is outputted to the output signal line 14. Then a H-level pulse is fed as the signal φRS to the gate of the MOS transistor T5 to turn it on, thereby to reset the voltage at the node between the MOS transistor T2 and the capacitor C. Thereafter a H-level pulse is fed as the signal φV to the MOS transistor T4 again to turn it on so that a noise signal having a value commensurate with the voltage at the reset capacitor C is outputted to the output signal line 14.

As described above, with a solid-state image-sensing device having pixels configured as in any of the embodiments described above, it is possible to perform image sensing operation (photoelectric conversion and integration operation) simultaneously in all the pixels, and thus it is possible to achieve image sensing in global shutter mode. Incidentally, the reading-out of signals cannot be performed simultaneously with photoelectric conversion and integration operation. For example, in a solid-state image-sensing device having VGA (video graphics array) pixels, since its total number of pixels is about 310,000, assuming that image signals are read out at a data rate of 40 MHz, the time required to read them out is 1/100 seconds or less. However, the typical integration period is about 1/30 seconds, and, in the case of a CMOS-type solid-state image-sensing device, it is easy to increase the read-out data rate by divided reading. Thus, even when the reading-out of signals cannot be performed simultaneously, the device's shooting speed is not greatly affected.

What is claimed is:

1. A solid-state image-sensing device having a plurality of pixels each comprising:
    a photoelectric converter outputting an electric signal commensurate with an amount of incident light;
    an integrating transistor receiving at a control electrode thereof the electric signal from the photoelectric converter; and
    an integrating capacitive element having one end thereof connected to a first electrode of the integrating transistor, the integrating transistor and the integrating capacitive element together performing integration operation,
    wherein the pixels each further comprise:
    an integration operation controller controlling the integration operation by the integrating transistor and the integrating capacitive element by feeding to the control electrode of the integrating transistor a control signal that turns the integrating transistor off.

2. The solid-state image-sensing device according to claim 1,
    wherein, in all the pixels, the integration operation controller keeps the integrating transistor on in an identical period, and
    wherein, in all the pixels, the photoelectric converter performs photoelectric conversion operation and the integrating transistor and the integrating capacitive element perform the integration operation with identical timing.

3. The solid-state image-sensing device according to claim 2,
    wherein the photoelectric converter comprises:
    a photoelectric conversion element receiving at a first electrode thereof a direct-current voltage and generating a photoelectric charge commensurate with the amount of incident light; and
    a photoelectric conversion transistor having a first electrode, a second electrode, and a control electrode,
    the first electrode of the photoelectric conversion transistor being connected to the second electrode of the photoelectric conversion element so that the photoelectric conversion transistor is connected in series with the photoelectric conversion element,
    the photoelectric conversion transistor outputting at a node between the first electrode thereof and the second electrode of the photoelectric conversion element the electric signal commensurate with the amount of incident light that is to be fed to the control electrode of the integrating transistor,
    wherein a voltage fed to the control electrode of the photoelectric conversion transistor is kept constant,
    wherein the integration operation controller is a switching element that feeds the control signal to the control electrode of the integrating transistor,
    wherein, when the switching element is off, the integrating transistor operates based on the electric signal commensurate with the amount of incident light from the photoelectric conversion transistor, and
    wherein, when the switching element is on, the control signal is fed to the integrating transistor to turn the integrating transistor off so that the integrating transistor and the integrating capacitive element are disabled from performing the integration operation.

4. The solid-state image-sensing device according to claim 3, further comprising:
    an electric charge transfer switching element connecting and disconnecting the photoelectric conversion element and the photoelectric conversion transistor to and from each other,
    wherein, to enable the integrating transistor and the integrating capacitive element to perform the integration operation, the electric charge transfer switching element is turned on so that the photoelectric conversion element and the photoelectric conversion transistor are electrically connected to each other, and
    wherein, to disable the integrating transistor and the integrating capacitive element from performing the integration operation, the electric charge transfer switching element is turned off so that the photoelectric conversion element and the photoelectric conversion transistor are electrically disconnected from each other.

5. The solid-state image-sensing device according to claim 4, further comprising:
a resetting switching element forcibly discharging the photoelectric charge generated in the photoelectric conversion element to outside,
wherein, when the integrating transistor and the integrating capacitive element are disabled from performing the integration operation, the resetting switching element is turned on so that the photoelectric charge generated in the photoelectric conversion element to outside is forcibly discharged to outside.

6. The solid-state image-sensing device according to claim 2,
wherein the photoelectric converter comprises:
a photoelectric conversion element receiving at a first electrode thereof a direct-current voltage and generating a photoelectric charge commensurate with the amount of incident light; and
a photoelectric conversion transistor having a first electrode, a second electrode, and a control electrode,
the first electrode of the photoelectric conversion transistor being connected to the second electrode of the photoelectric conversion element so that the photoelectric conversion transistor is connected in series with the photoelectric conversion element,
the photoelectric conversion transistor outputting at a node between the first electrode thereof and the second electrode of the photoelectric conversion element the electric signal commensurate with the amount of incident light that is to be fed to the control electrode of the integrating transistor,
wherein a voltage fed to the control electrode of the photoelectric conversion transistor is kept constant, and the photoelectric conversion transistor also acts as the integration operation controller as a result of the photoelectric conversion transistor receiving at the second electrode thereof a state switch signal that is at either a first voltage or a second voltage at a time,
wherein, when the state switch signal is at the first voltage, the integrating transistor operates based on the electric signal commensurate with the amount of incident light from the photoelectric conversion transistor, and
wherein, when the state switch signal is at the second voltage, the control signal is fed via the photoelectric conversion transistor to the integrating transistor to turn the integrating transistor off so that the integrating transistor and the integrating capacitive element are disabled from performing the integration operation.

7. The solid-state image-sensing device according to claim 6, further comprising:
an electric charge transfer switching element connecting and disconnecting the photoelectric conversion element and the photoelectric conversion transistor to and from each other,
wherein, to enable the integrating transistor and the integrating capacitive element to perform the integration operation, the electric charge transfer switching element is turned on so that the photoelectric conversion element and the photoelectric conversion transistor are electrically connected to each other, and
wherein, to disable the integrating transistor and the integrating capacitive element from performing the integration operation, the electric charge transfer switching element is turned off so that the photoelectric conversion element and the photoelectric conversion transistor are electrically disconnected from each other.

8. The solid-state image-sensing device according to claim 7, further comprising:
a resetting switching element forcibly discharging the photoelectric charge generated in the photoelectric conversion element to outside,
wherein, when the integrating transistor and the integrating capacitive element are disabled from performing the integration operation, the resetting switching element is turned on so that the photoelectric charge generated in the photoelectric conversion element to outside is forcibly discharged to outside.

9. The solid-state image-sensing device according to claim 2,
wherein the photoelectric converter comprises:
a photoelectric conversion element receiving at a first electrode thereof a direct-current voltage and generating a photoelectric charge commensurate with the amount of incident light; and
a photoelectric conversion transistor having a first electrode, a second electrode, and a control electrode,
the first electrode of the photoelectric conversion transistor being connected to the second electrode of the photoelectric conversion element so that the photoelectric conversion transistor is connected in series with the photoelectric conversion element,
the photoelectric conversion transistor outputting at a node between the first electrode thereof and the second electrode of the photoelectric conversion element the electric signal commensurate with the amount of incident light that is to be fed to the control electrode of the integrating transistor,
wherein the photoelectric conversion transistor also acts as the integration operation controller as a result of the photoelectric conversion transistor receiving at the control electrode thereof a state switch signal that is at either a first voltage or a second voltage at a time,
wherein, when the state switch signal is at the first voltage, the integrating transistor operates based on the electric signal commensurate with the amount of incident light from the photoelectric conversion transistor, and
wherein, when the state switch signal is at the second voltage, the control signal is fed via the photoelectric conversion transistor to the integrating transistor to turn the integrating transistor off so that the integrating transistor and the integrating capacitive element are disabled from performing the integration operation.

10. The solid-state image-sensing device according to claim 9, further comprising:
an electric charge transfer switching element connecting and disconnecting the photoelectric conversion element and the photoelectric conversion transistor to and from each other,
wherein, to enable the integrating transistor and the integrating capacitive element to perform the integration operation, the electric charge transfer switching element is turned on so that the photoelectric conversion element and the photoelectric conversion transistor are electrically connected to each other, and
wherein, to disable the integrating transistor and the integrating capacitive element from performing the integration operation, the electric charge transfer switching element is turned off so that the photoelectric conversion element and the photoelectric conversion transistor are electrically disconnected from each other.

11. The solid-state image-sensing device according to claim 10, further comprising:

a resetting switching element forcibly discharging the photoelectric charge generated in the photoelectric conversion element to outside, wherein, when the integrating transistor and the integrating capacitive element are disabled from performing the integration operation, the resetting switching element is turned on so that the photoelectric charge generated in the photoelectric conversion element to outside is forcibly discharged to outside.

12. The solid-state image-sensing device according to claim 2, further comprising:

an output signal line connected to the pixels, the pixels outputting electrical signals to the output signal line, wherein the pixels each further comprise:

an amplifier amplifying the electric signal appearing in the integrating capacitive element, and;

a read switch connected to the output signal line and outputting the electric signal amplified by the amplifier to the output signal line.

* * * * *